United States Patent
Elbahri et al.

(10) Patent No.: US 7,914,850 B2
(45) Date of Patent: Mar. 29, 2011

(54) METHOD FOR PRODUCING NANOSTRUCTURES ON A SUBSTRATE

(75) Inventors: Mady Elbahri, Kiel (DE); Rainer Adelung, Kiel (DE); Dadichi Paretkar, Kiel (DE)

(73) Assignee: Christian-Albrechts-University, Kiel, Kiel (DE)

( * ) Notice: Subject to any disclaimer, the term of this patent is extended or adjusted under 35 U.S.C. 154(b) by 531 days.

(21) Appl. No.: 12/086,334

(22) PCT Filed: Nov. 24, 2006

(86) PCT No.: PCT/DE2006/002066
§ 371 (c)(1),
(2), (4) Date: Jun. 11, 2008

(87) PCT Pub. No.: WO2007/076745
PCT Pub. Date: Jul. 12, 2007

(65) Prior Publication Data
US 2009/0269495 A1 Oct. 29, 2009

(30) Foreign Application Priority Data

Dec. 15, 2005 (DE) .......................... 10 2005 060 407

(51) Int. Cl.
*B82B 3/00* (2006.01)
*C30B 29/60* (2006.01)
*C30B 7/00* (2006.01)

(52) U.S. Cl. ........ 427/256; 427/180; 427/197; 427/299; 427/314; 428/357

(58) Field of Classification Search .................. 427/256, 427/299, 314, 180, 197
See application file for complete search history.

(56) References Cited

U.S. PATENT DOCUMENTS
5,858,862 A 1/1999 Westwater et al.

FOREIGN PATENT DOCUMENTS
WO WO 2004/088005 * 3/2004
WO WO 2004/088005 11/2004

OTHER PUBLICATIONS

Helm et al., "Deposition from a Drop: Morphologies of Unspecifically Bound DNA", Journal of Physics: Condensed Matter, vol. 17, (2005).*
Poirier et al., "Deposition of Nanoparticle Suspensions by Aerosol Flame Spraying", Journal of Thermal Spray Technology, vol. 12 No. 3, (2003).*
Satoshi et al., "Growth Conditions for Wurtzite Zone Oxide Films in Aqueous Solutions", J. Materials Chemistry, vol. 12, pp. 3773-3778, 2002.
Tsapis et al., "Onset of Buckling in Drying Droplets of Colloidal Suspensions", Physical Review Letters, vol. 94, pp. 018302-1-018302-4, 2005.
Wang et al., "Low Temperature Solvothermal Synthesis of Multiwall Carbon Nanotubes", Nanotechnology, vol. 16, pp. 21-23, 2005.

* cited by examiner

*Primary Examiner* — Michael Kornakov
*Assistant Examiner* — Lisha Jiang
(74) *Attorney, Agent, or Firm* — Diederiks & Whitelaw PLC

(57) ABSTRACT

A method for producing nanostructures on a substrate, by dripping a solution of nanostructure-forming material in water onto the substrate heated to a temperature above the temperature at which a drop of the solution is initially suspended on a vapor cushion after being applied by dripping onto the substrate, with nanostructures being formed when the drops evaporate.

6 Claims, 6 Drawing Sheets

METHOD FOR PRODUCING NANOSTRUCTURES ON A SUBSTRATE

CROSS-REFERENCE TO RELATED APPLICATIONS

This application represents a National Stage Application of PCT/DE2006/002066 entitled "Method for Producing Nanostructures on a Substrate" filed Nov. 24, 2006.

BACKGROUND OF THE INVENTION

The invention concerns a method for producing nanostructures on a substrate. The present invention especially relates to the production of nanowires and/or linear arrangements of nanodots (clusters) as well as the production of carbon nanotubes directly on almost any desired carrier. The invention also concerns the production of nanostructures on silicon wafers, in particular on MEMS or microchips.

Nanostructures as well as nanowires and nanotubes are presently in the spotlight of current research. They represent a class of materials, which by virtue of quantum effects have novel electrical, optical, magnetic and thermodynamic properties, among other things. Aside from the primary academic questions, the problem of reproducible mass production with the simplest possible resources in order to promptly develop the industrial use of nanostructures is also presented.

Simple methods for producing nanoparticle aggregates are certainly known (refer to, for example, Tsapis et al, "Onset of Buckling in Drying Droplets of Colloidal Suspension," Physical Review Letters, 94, 018302-1-018302-4, 2005); however, the production of extensive regular nanostructures on a substrate surface is to this day a difficult process, which is usually associated with several steps and high costs. Typical methods for the production of such structures are Vapor Liquid Solid (VLS) or MOCV methods. These methods are certainly relatively universally applicable, but atmospheric control (UHV), as well as also the need for high temperatures (600-1000° C.), require expensive equipment and make the synthesis time consuming. Prestructured substrates, such as, for example, MEMS, cannot be readily exposed to such high temperatures.

In order to reduce costs, the person skilled in the art is also acquainted with wet chemical production methods in aqueous solution, which show the desired results at temperatures below 100° C. and at atmospheric pressure (refer to, for example, Law et al, "Nanowire Dye-sensitized Solar Cells," Nature Materials, 4, 455-459, 2005). However, apart from their very slow production flow (processing times of several hours to days), the wet chemical methods have other disadvantages. No epitactic growth is possible on silicon, for example (refer to J. Phys. Chem. B 2001, 105, 3350-3352). Solvents are used in many cases, which present problems with regard to their disposal.

There is great interest these days, for example, in the production of zinc oxide (ZnO) nanostructures, for example, nanorods and nanotubes. The reason is that, as a semiconductor, ZnO is able to form a large variety of nanostructures. In addition, its versatile applications as optoelectronic components, lasers, field emission and gas sensing materials are also taken into consideration (for the production and use of nanotubes and nanorods, refer also to Advanced Materials 2005, 17, 2477). For the epitactic production of ZnO structures are used either special substrates, such as gallium nitride (GaN), or silicon substrates coated with a so-called seeding layer, which generally consists of a ZnO thin film heated to 400° C.

The direct non-epitactic production of extensive nanostructured ZnO structures on substrates is unknown to this date.

A further example are carbon nanotubes (CNT), which are called smart materials. They are used in fuel cells, biogas sensors, field effect transistors, among others. In this case, the known production methods (arc, laser, CVD, PECVD) also show a high technical complexity (high temperature, vacuum, etc.). An alternative solvothermal synthesis method at low temperature (310° C.) indeed solves this problem (Wang et al., Nanotechnology 16, 21-23, 2005), but the process still takes approx. 20-40 hours with a meager yield.

A third example is constituted by water soluble inorganic nanostructures, such as CaCO3, BaCO3, whose use is recommend for new applications in biotechnology due to their unusual mechanical and optical properties. The controlled production of such materials is carried out by mixing salts with polymers (biopolymers, refer to Shu et al, Nature Materials 4, 51, 2005). Wires made of such materials, which have a diameter of less than 100 nm, are unknown to this date.

An even more important example is the production of nanowires consisting of nanoclusters. It is already known that the arrangement of nanoclusters in 1D, 2D or 3D can lead to new properties, which are not present in disarrayed clusters, and which are based on the nearest neighbor interaction between the clusters, such as, for example, magnetization flip (application: data storage) and plasmon conductivity (application: optical fibers) (refer to as sources, for example: Nature Materials, 2, 229, 2003 or Eur. J. Inorg. Chem. 2455, 2001).

In contrast to the known and simple arrangement of nanoparticles in 2D and 3D, the arrangement in 1D is a complex procedure, with which a template (for example, mask, casting mold) must usually be used. This template limits the materials to be used, and may lead to disturbances in the formation of the nanowire from the clusters (when the template is removed, for instance) or its properties (for example, if a nanowire is used as a sensor, the template material that has not been entirely removed may reduce the sensitivity).

Hence, it is not unusual that the different processes, which are used for producing nanostructures, have common disadvantages, like complexity, high costs, low speed.

SUMMARY OF THE INVENTION

It is therefore the object of the invention to disclose a method for producing nanostructures on almost any desired substrate, which produces in high yield and extensive cover already after a very short processing time.

The object is attained by means of a method having the features described in the main claim. The dependent claims describe advantageous embodiments of the invention.

The method according to the invention differs from all the methods for producing nanostructures known to the person skilled in the art in that it is not based on a gradual, self-organized formation of these structures from their constituents, as is the case with epitactic growth. The starting point for nanowire growth in the process described herein is rather a highly unstable state characterized by unbalanced reactions. The invention takes advantage of a natural effect which has not been fully understood until now. The method delivers nonetheless well reproducible results and appears to work for a series of different materials, of which naturally only selected ones can be experimentally tested, but which should however not restrict the invention.

The method according to the present invention essentially comprises the following steps:
1. Introducing the nanostructure forming material into water in order to produce a solution.

2. Adding catalyzing particles to the solution, if necessary.
3. Heating the substrate to temperatures above 200° C.
4. Adding individual drops of the solution on the heated substrate.
5. An evaporation of the drops occurs as a result of the Leidenfrost effect, during which nanostructures are formed and deposited on the substrate.
6. The substrate is tilted if necessary, so that a moving drop deposits nanostructures along its path under the influence of gravity.

It appears to be necessary for the formation of nanostructures that the solution evaporates locally in an explosion-like manner. The Leidenfrost effect appears to play an important role in this process, as a consequence of which a water drop falling on a hot plate is suspended and glides on a water vapor cushion, whereby its evaporation is somewhat delayed. The effect occurs when the hot plate is at a temperature that is beyond the Leidenfrost temperature, which at normal water pressure is somewhat above 200° C. Independently of the question regarding reaction kinetics, which currently remains unexplained, it is very advantageous, if not even necessary, to make the most of the Leidenfrost effect when dripping the drops of the material solution. This is because a uniform distribution of the deposited nanostructures is favored and, if required, also a larger area will be covered as the drop slides over the substrate.

The experimental findings demonstrate that the first nanostructure formations will have formed within a few seconds over the entire surface in the region of the applied drop. In this connection, it should be especially emphasized that the same process steps can serve for the production of very different structures, which can in part even form simultaneously. The diverse products of the method according to the present invention will hereinafter be illustrated and explained in more detail with reference to scanning electron microscope images.

DETAILED DESCRIPTION OF THE PREFERRED EMBODIMENT

Figure 1:
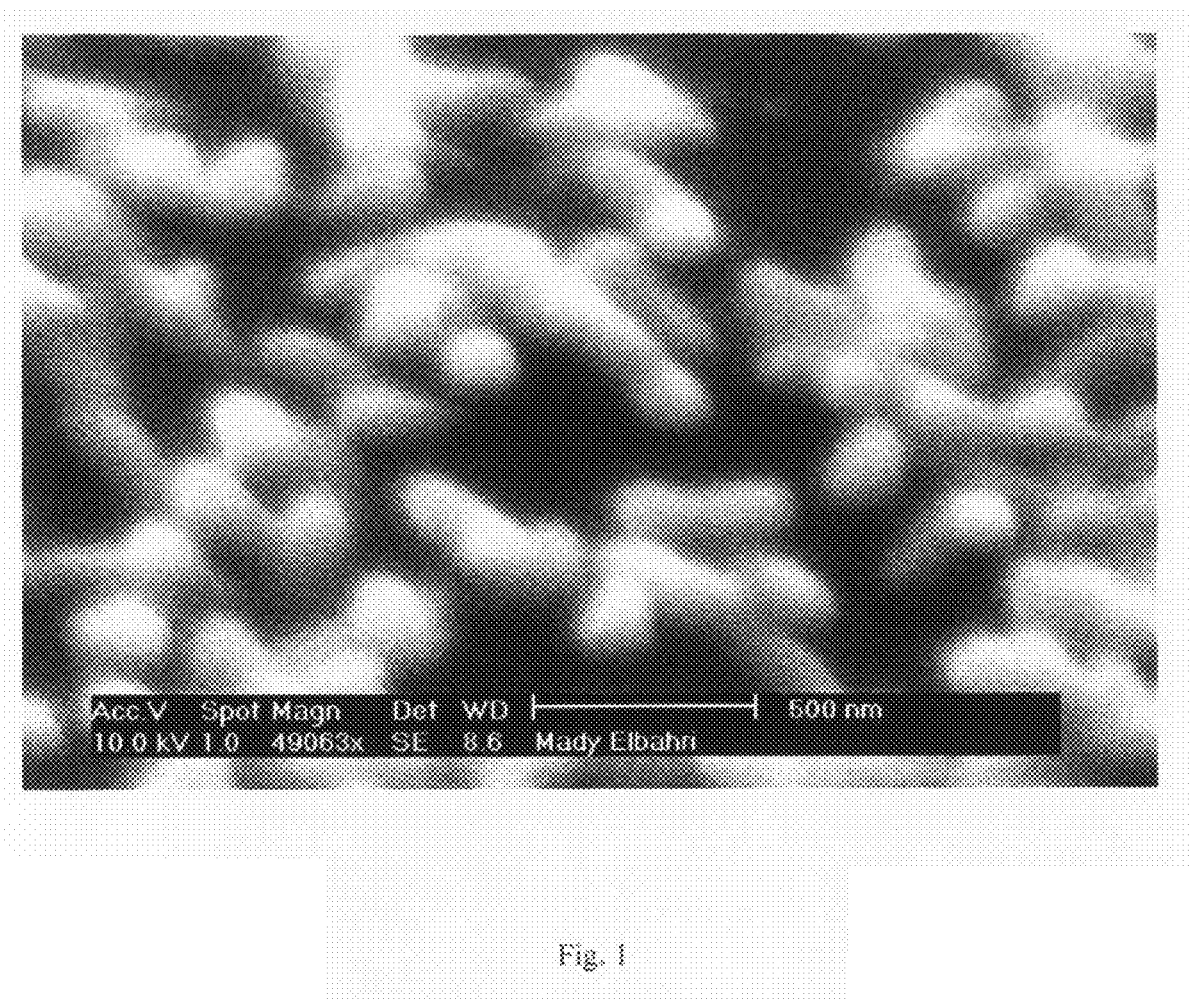
FIG. 1 shows zinc oxide nanorods formed directly by evaporating drops of an aqueous zinc acetate solution.

FIG. 1 shows zinc oxide nanorods, which are formed directly by evaporating drops of an aqueous 0.02 M zinc acetate solution. For this purpose, the heated silicon substrate does not require a seeding layer and no catalysts are used. The displayed structures have formed after 2-3 minutes processing time and cover the entire surface of the substrate in the region of the surface that was previously wetted by the drop. ZnO forms from the zinc ions of the solution and presumably the oxygen of the ambient air. No nanostructures will form, but only a thin film, if the substrate is only heated to temperatures between 25 and 200° C.

A preferred embodiment of the invention consists of the addition of catalyst particles, preferably noble metal nanoparticles. Gold particles with a diameter of about 20 nm are preferably added to the nanostructure material solution described above.

The gold particles as such can be commercially obtained from Aldrich Inc. as a solution stabilized by means of organic as well as inorganic additives. The stabilization prevents the agglomeration of the particles and is indispensable. As was shown, the stabilizers containing carbon also have a tendency to form, more or less inevitably, nanostructures when using the method according to the invention.

Figure 2:
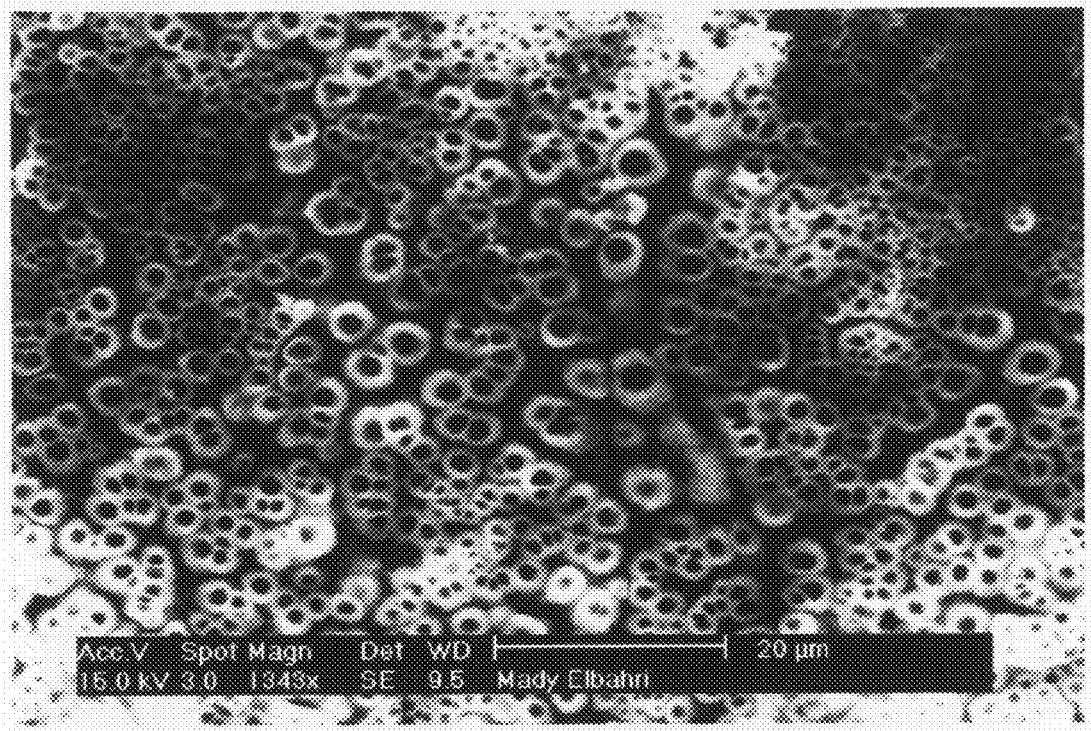
FIG. 2 shows zinc oxide nanotubes formed with the admixture of catalyst particles, as well as an enlarged view detailing the tube structure.
Figure 2:
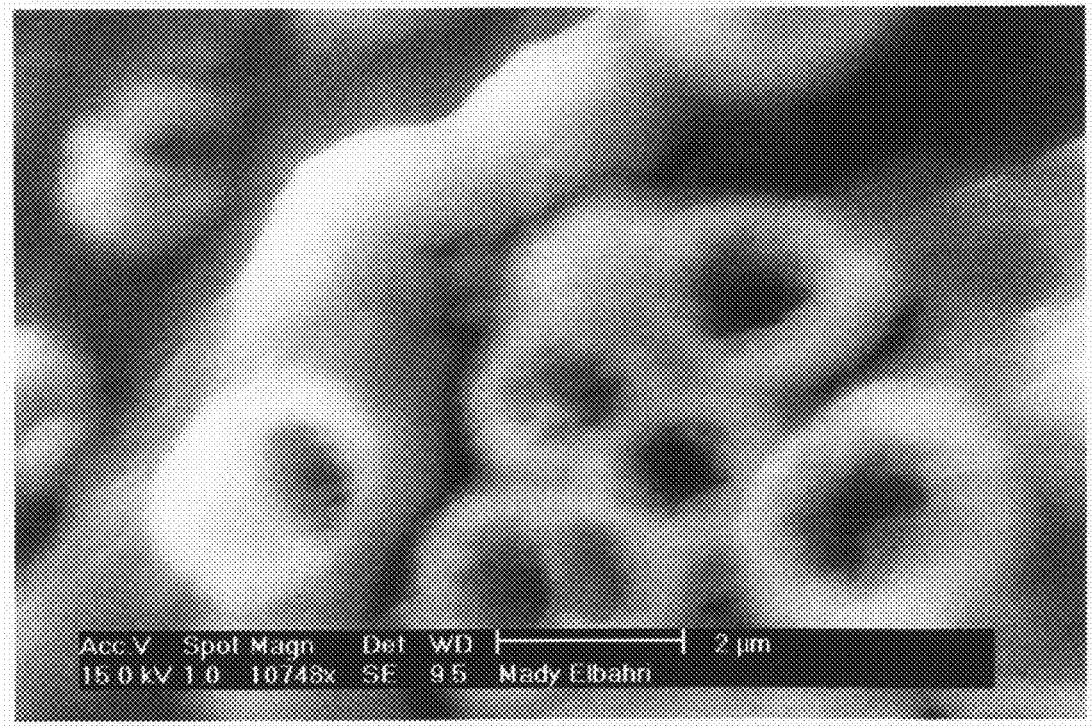

FIG. 2 shows zinc oxide nanotubes, which form after a few minutes as a result of the admixture of catalyst particles (ZnO solution with Aldrich solution at a 1:3 ratio). In the lower part of FIG. 2 is shown an enlarged cutout of the image at the upper part of the figure in order to show the tube structure in more detail. The shown result can also not be attained in this case if the substrate is heated below 200° C. or is only gradually heated.

Figure 3:
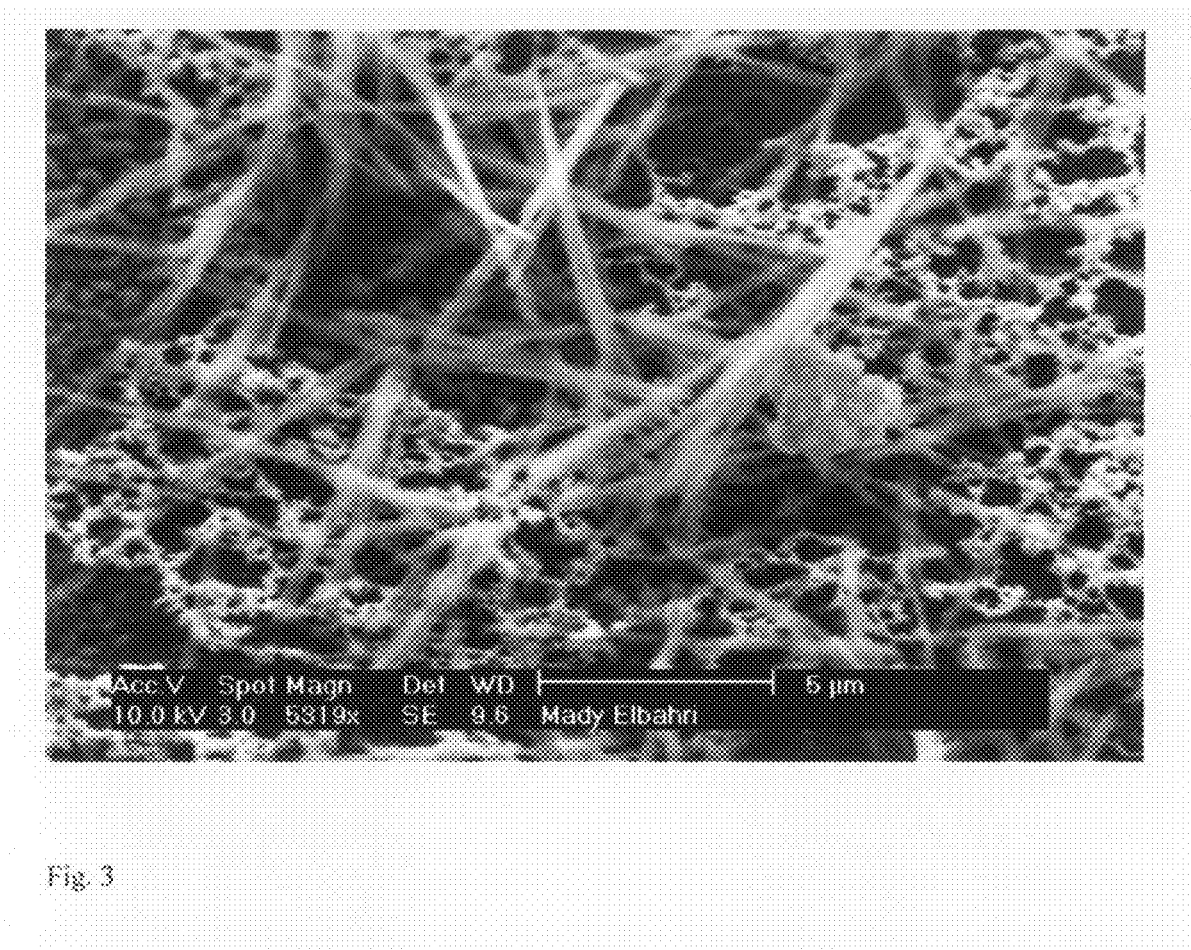
FIG. 3 particularly illustrates a fractal-like, but still evenly distributed, gold net on a substrate below other nanostructures.

An interesting side effect of the admixture of catalyst particles concerns the gold retention on the substrate. When the water runs off the heat plate, the gold cannot escape, but is apparently not readily incorporated into the previously mentioned nanostructures. It has been found, rather, that gold as such forms a fractal-like, but still evenly distributed, gold net on the substrate, which is still arranged below other nanostructures (in this case: distant wires, see below), as demonstrated in FIG. 3. Whether this network also plays a role in the formation of more complex nanostructures is still uncertain. The gold net can be produced, for example, with a solution of 0.03 M ZnO in 0.1 M NaOH with the addition of the Aldrich solution at a volume rate of 1:6.

Figure 4:
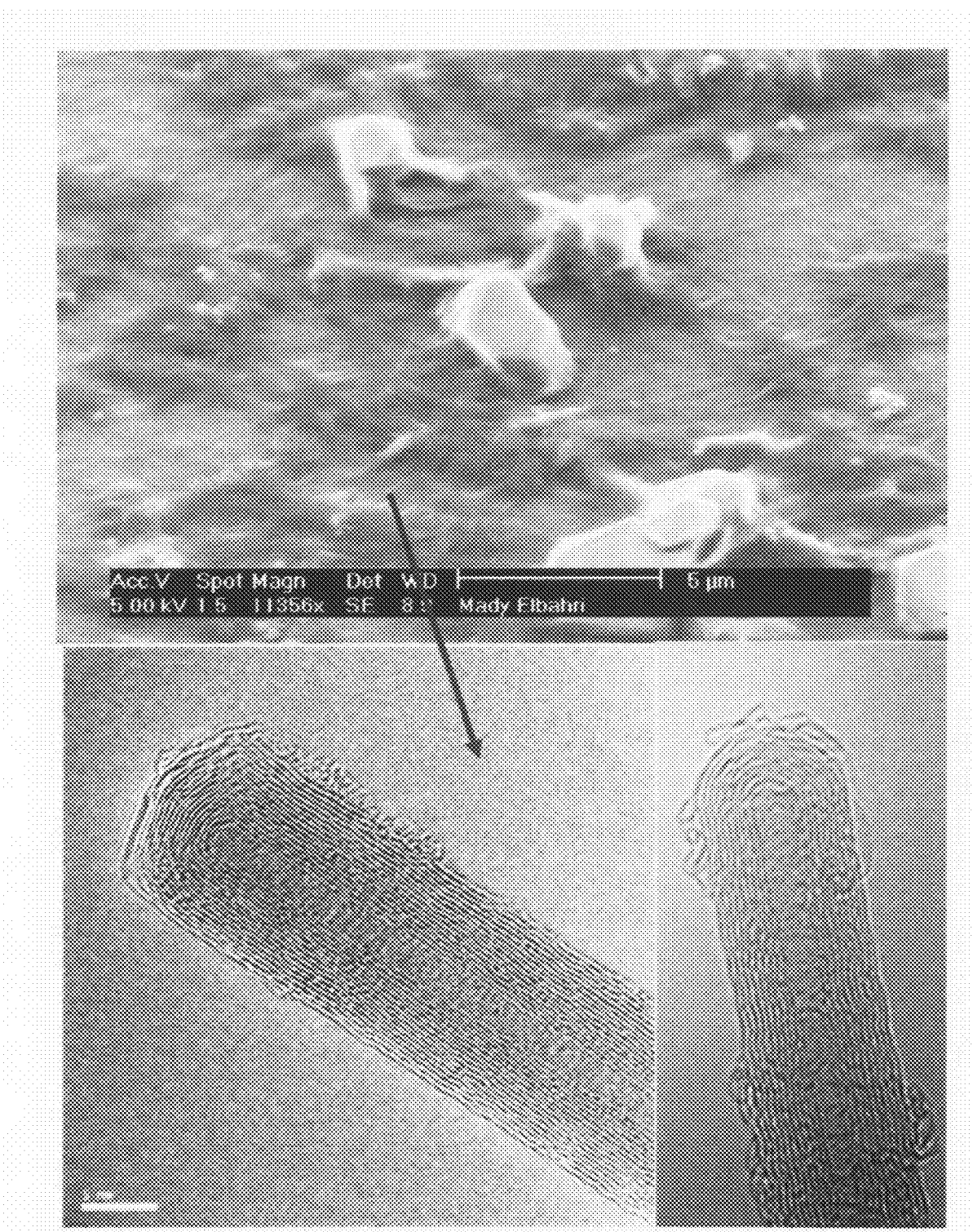
FIG. 4 depicts transmission electron microscope images showing multi-walled carbon nanotubes and projecting wires growing from crystals.

FIG. 4 shows transmission electron microscope images after the use of the same ZnO/NaOH/Aldrich solution, in which a network consisting of multiwall carbon nanotubes (MWCNT) can be recognized (the cutout enlargements should be noted). Curiously enough, these MWCNT are located from the outset on the substrate and form thus an electrically conductive network. The carbon originates in the examples from the stabilizer of the Aldrich solution. However, the MWCNT can also be produced very systematically, for example, when a pure carbon solution is dripped onto the substrate.

Figure 5:
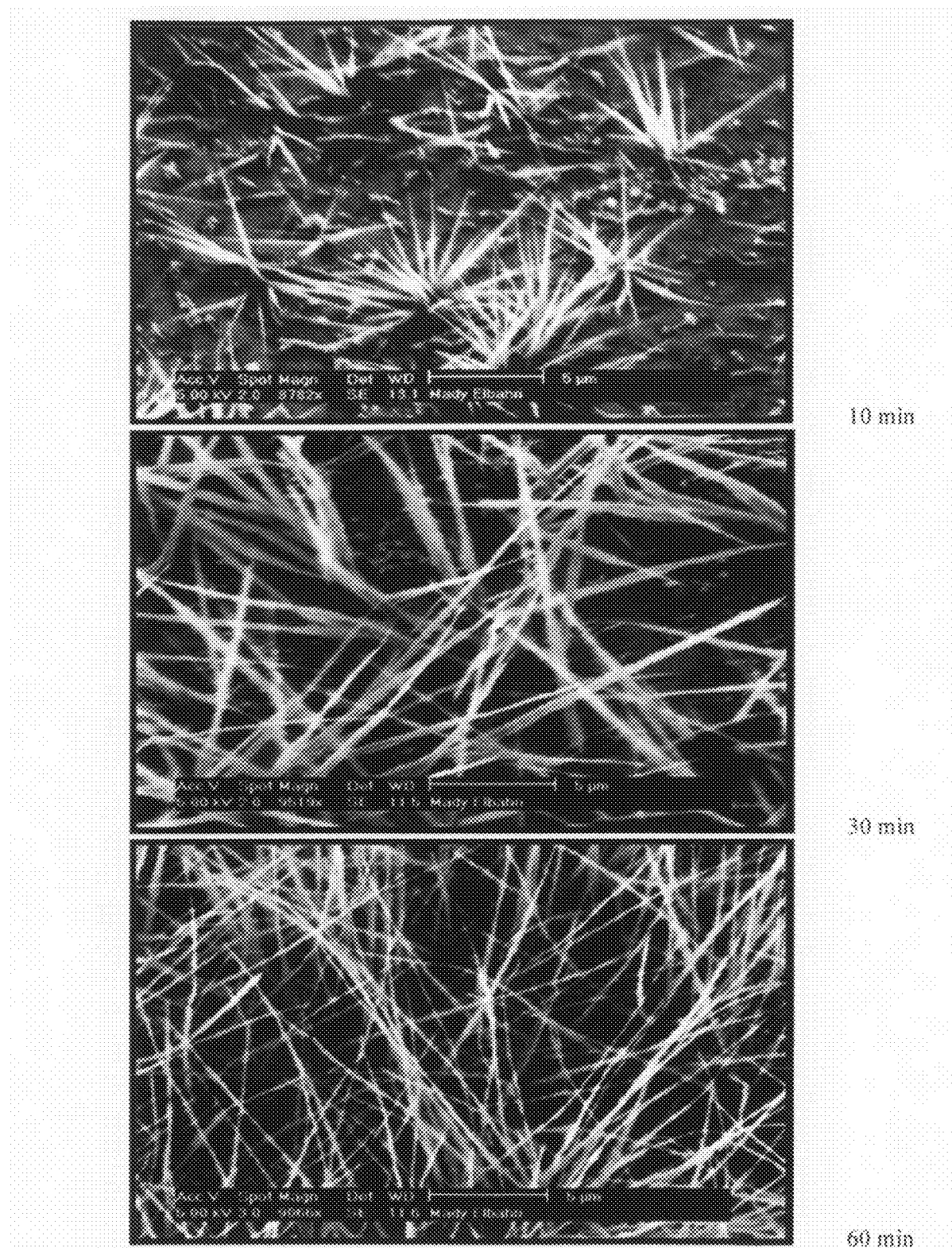
FIG. 5 shows different stages of formation of nanowires growing off a substrate.

If, after the above mentioned solution is dripped onto the substrate, it is left still heated to settle in ambient air, projecting wires (clusters) will grow from the crystals, which are likewise shown in FIG. 4. The nanowires will grow within one hour, while the cover density increases and the wire density decreases. It appears that the already existing wires regenerate and new wires with a smaller diameter form. The wire diameters vary between 100 nm at the start and subsequently approx. 60 nm, while the length grows from approx. 3 μm after 15 minutes to 25 μm after 1 hour. A subsequent growth of the wires can no longer be detected, although it must not have come to a complete stop. FIG. 5 shows the nanowires growing off the substrate in the different stages of their formation. The times of the photograph after application of the drop of solution are shown next to each image. The vertical wires are inorganic and water soluble. They are made of carbon (from the stabilizer of the Aldrich solution), sodium (from the sodium hydroxide solution for the dilution of the ZnO) and oxygen (probably from the ambient air).

It should especially be pointed out that in the above-mentioned examples all nanostructures have formed directly from ions in solution (except for the fractal gold net, which forms from gold colloids). It is thus not necessary to add nanoparticles to the solution in advance in order to deposit these on the substrate. This represents an essential difference with reference to the conventional deposition, for example, of carbon nanotubes, which otherwise have to be previously present in powder form. Nevertheless, the method according to the invention can naturally also be carried out by adding nanoparticles to the aqueous solution, which is afterward dripped.

A very advantageous embodiment of the method according to the invention consists of tilting the substrate against the horizontal plane prior to or immediately after applying the drop of solution.

By tilting the substrate, the nanostructures can be accurately deposited along a preferred direction (the tilt gradient). The material to be formed or deposited is diluted and/or suspended as described above. Like above, the substrates are heated to temperatures of more than 200° C. Afterward, droplets with diameters of approx. 1-2 mm are deposited on the surface. Unlike everything so far, the substrate is tilted, while the tilt angle determines the flow speed of the drop. In this case, the droplet is also suspended on a vapor cushion as a result of the Leidenfrost effect.

On account of the release of material from the drop, which basically occurs at the edge of the drop (coffee stain effect), nanodots (clusters) are deposited on the substrate while the drop flows along the direction of movement. This occurs at relatively regular intervals in dependence upon the flow speed of the drop, and consequently also the adjusted tilt angle. If the clusters are sufficiently close to each other, they virtually form a nanowire, which can be, for example, electrically conducting. Molecules can accumulate between the clusters, which may become important in applications as chemical sensors. However a sorting effect with regard to the size of the clusters is also apparent: The largest and/or heaviest clusters are deposited first, the smaller ones only later. The cluster size distribution varies consequently from large to small along the flow direction of the drop, showing quite small fluctuations, that is, extensive wire segments consist of clusters of the same approximate size.

The tilt deposition evidently is inversely proportional to the known lotus effect, where weakly adhering material is collected by a water drop flowing by and taken along, for which reason it could be designated as the anti-lotus effect.

The substrate temperature above 200° C. to enforce the Leidenfrost effect also plays an important role here, as the gliding of the drop on its own water vapor cushion appears to have a favorable effect on the even distribution of the subsequently noticeable distribution of the nanodots.

Figure 6:
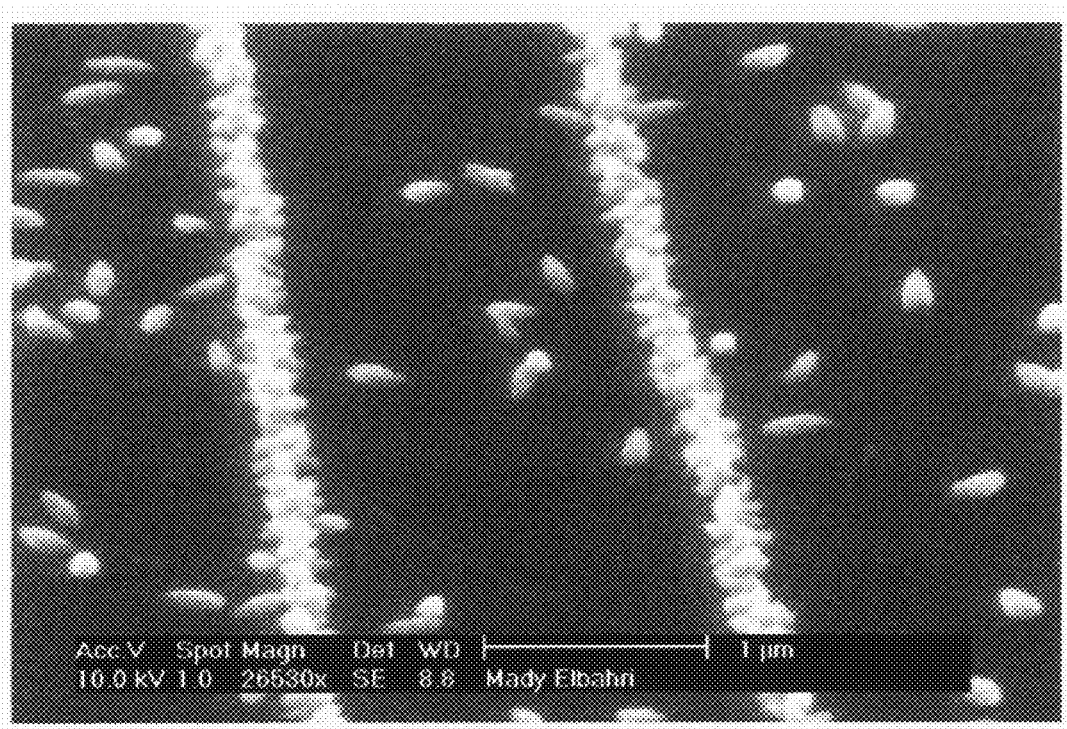
FIG. 6 presents an example of the application of the antilotus effect, depicting both parallel nanowires constituted by nanorods and a nanowire constituted by separated nanodots.
Figure 6:

An example of the application of the anti-lotus effect, that is, the combination of Leidenfrost effect, coffee stain effect and tilting, can be seen in FIG. 6. A drop of zinc acetate/water (exactly as with ZnO nanorods) is used in this case. The upper image shows parallel nanowires consisting of nanorods. The lower image shows a nanowire consisting of nanodots, which are separated from one another. In both cases, the nanostructures appear within a few seconds after the ZnO solution has been dripped onto the substrate.

A further example (not shown) concerns the production of silver structures. It is known that the thermal decomposition of $AgNO_3$ (silver nitrate) into metallic silver occurs at 180° C., so that the nanoparticles can be realized and arranged in one step in a ID array.

It appears that is it possible to easily and rapidly produce many different materials in this way and without a template. The research work with the purpose of exploring the potential of the invention is still in the early stages. It has been clear until now, however, that steps 1, 3, 4, and 5 of the method described above are the necessary requirement for the still extensively misunderstood reaction kinetics that occur during the formation of nanostructures on substrates, where the only requirement to be placed on the substrates is that they withstand temperatures somewhat above 200° C. The influence of the superficial roughness of the substrate remains to be examined. Monocrystalline silicon wafers, if necessary with a $SiO_2$ top layer, have been used in the experiments presented herein.

The invention claimed is:

1. A method for producing nanostructures on a substrate comprising:
    dripping drops of a solution of nanostructure forming material in water onto said substrate, wherein the temperature of the substrate is above a temperature at which a drop of the solution is initially suspended on a vapor cushion when applied via dripping onto the substrate, and
    forming nanostructures when the drops evaporate.

2. The method of claim 1, characterized in that the temperature of the substrate is adjusted to above 200° C.

3. The method of claim 1, further comprising: tilting the substrate against a horizontal plane before or immediately after the solution is dripped onto said substrate.

4. The method of claim 1, further comprising:
    heating between several minutes and a few hours after evaporation of the drops, so that distant nanostructures continue growing.

5. The method of claim 1, further comprising: admixing catalytic nanoparticles of noble metal to the solution.

6. The method of claim 5, characterized in that gold particles with a diameter of about 20 nm are admixed to the solution.

* * * * *